US008175562B2

United States Patent
Fratti et al.

(10) Patent No.: US 8,175,562 B2
(45) Date of Patent: May 8, 2012

(54) AUTOMATIC GAIN CONTROL FOR ENHANCED BIT ERROR RATE PERFORMANCE

(75) Inventors: Roger A. Fratti, Mohnton, PA (US); Xiao-an Wang, Allentown, PA (US)

(73) Assignee: Agere Systems Inc., Allentown, PA (US)

(*) Notice: Subject to any disclaimer, the term of this patent is extended or adjusted under 35 U.S.C. 154(b) by 874 days.

(21) Appl. No.: 11/553,635

(22) Filed: Oct. 27, 2006

(65) Prior Publication Data
US 2008/0102774 A1    May 1, 2008

(51) Int. Cl.
*H04B 1/06* (2006.01)
(52) U.S. Cl. ........... 455/238.1; 455/232.1; 455/234.1; 330/141; 330/278
(58) Field of Classification Search ............ 455/234.1, 455/424, 425, 456.5, 456.6, 561, 550.1, 575.1, 455/67.11, 200.1, 232.1, 234.2–253.2; 330/278, 330/279, 9, 306; 375/345, 267; 327/179
See application file for complete search history.

(56) References Cited

U.S. PATENT DOCUMENTS

| | | | | |
|---|---|---|---|---|
| 4,164,626 A | * | 8/1979 | Fette | 704/208 |
| 4,449,144 A | * | 5/1984 | Suzuki | 348/699 |
| 5,296,822 A | * | 3/1994 | Cockey, IV | 330/306 |
| 5,696,708 A | * | 12/1997 | Leung | 708/313 |
| 6,018,554 A | * | 1/2000 | Glover | 375/345 |
| 6,668,172 B1 | * | 12/2003 | Yoshimura | 455/441 |
| 6,711,384 B2 | * | 3/2004 | Kubo et al. | 455/68 |
| 6,779,752 B1 | * | 8/2004 | Ratkovic | 244/3.15 |
| 7,107,056 B2 | * | 9/2006 | Peng | 455/441 |
| 7,498,882 B2 | * | 3/2009 | Dally et al. | 330/279 |
| 2001/0028275 A1 | * | 10/2001 | Matsugatani et al. | 330/281 |
| 2002/0018530 A1 | * | 2/2002 | Kim et al. | 375/267 |
| 2002/0138186 A1 | * | 9/2002 | Kim | 701/37 |
| 2003/0064729 A1 | * | 4/2003 | Yamashita | 455/451 |
| 2003/0176201 A1 | * | 9/2003 | Sih et al. | 455/502 |
| 2003/0231054 A1 | * | 12/2003 | Magoon et al. | 330/9 |
| 2004/0244485 A1 | * | 12/2004 | Joseph et al. | 73/514.26 |
| 2005/0008171 A1 | * | 1/2005 | Hosoi et al. | 381/98 |
| 2005/0088367 A1 | * | 4/2005 | Kuhn et al. | 345/10 |
| 2006/0068733 A1 | * | 3/2006 | Wang et al. | 455/234.1 |
| 2006/0176093 A1 | * | 8/2006 | Song et al. | 327/179 |
| 2006/0217059 A1 | * | 9/2006 | Takano | 455/3.02 |
| 2007/0147556 A1 | * | 6/2007 | Kang et al. | 375/345 |
| 2007/0296500 A1 | * | 12/2007 | Yang | 330/278 |
| 2009/0004987 A1 | * | 1/2009 | Akahori | 455/251.1 |

\* cited by examiner

*Primary Examiner* — Duc Nguyen
*Assistant Examiner* — Charles Chow
(74) *Attorney, Agent, or Firm* — Ryan, Mason & Lewis, LLP

(57) ABSTRACT

An apparatus including automatic gain control (AGC) includes at least one variable gain amplifier (VGA) operative to receive an input signal and to generate an amplified signal. A gain of the VGA is controlled as a function of at least a first control signal. The apparatus further includes an AGC circuit coupled to the VGA and being operative to generate the first control signal. The AGC circuit has a bandwidth that is controlled as a function of at least the amplified signal and a second control signal, the second control signal being indicative of a motion of the apparatus.

22 Claims, 3 Drawing Sheets

AUTOMATIC GAIN CONTROL FOR ENHANCED BIT ERROR RATE PERFORMANCE

FIELD OF THE INVENTION

The present invention relates generally to electronic circuits, and more particularly relates to automatic gain control circuitry.

BACKGROUND OF THE INVENTION

In a number of applications utilizing wideband amplifiers, it is often desirable to electronically control the gain of the amplifier, without significantly affecting any other performance parameter of the amplifier. This type of gain control, generally referred to as automatic gain control (AGC), is particularly useful in communication circuits, such as radio frequency (RF) and intermediate frequency (IF) amplifiers, to improve signal-handling capability and/or the dynamic range of the amplifier.

AGC is a well-known technique that automatically changes the gain of a circuit so that a desired output signal generated by the circuit remains essentially constant despite variations in input signal strength. In a simple AGC system, an example of which is shown in FIG. 1, the input signal is amplified by a variable gain amplifier (VGA) 102 whose gain is controlled by an external control signal, Vc. The output of the VGA is then fed to a detector 104 which senses one or more parameters of the output signal, such as amplitude, carrier frequency, index of modulation, etc. Any undesired component is filtered out and the remaining signal is compared (e.g., by comparison block 106) with a reference signal. The result of the comparison is used to generate the control signal Vc for adjusting the gain of the VGA so as to obtain the desired output signal.

In a wideband code division multiple access (WCDMA) application, an AGC loop is generally required to have a large dynamic range. For example, according to the third-generation wireless format (3G) specification, a receiver must be able to accommodate signal levels between −106.7 decibels referenced to a milliwatt (dBm) and −25 dBm. A step in power occurs, for example, when a WCDMA receiver makes measurements on the signal quality from neighboring base stations. One possible scenario is that a neighboring base station is transmitting at a different carrier frequency. The in-phase/quadrature (IQ) demodulator, sometimes referred to as a base-band demodulator, then changes carrier frequency for a short period of time which leads to an abrupt change in the received power. To minimize the measurement time, the AGC loop should compensate for the new received power level as fast as possible.

AGC bandwidth impacts the bit error rate (BER) performance of a system. If the AGC bandwidth is too low, then the system will not be able to sufficiently track power changes of the channel over which the system is communicating. If the AGC bandwidth is too high, then the system will exhibit an undesirable amount of gain noise. Generally, the desired AGC bandwidth of a communication system will depend upon, among other characteristics, the speed of motion of the handsets or other terminals used in the system. For instance, if a user is walking at a pedestrian speed of about 3 kilometers per hour (km/h), then the AGC bandwidth should be relatively narrow. Alternatively, if the user is driving in a car at a speed of about 120 km/h, then the AGC bandwidth should be relatively wide.

Unfortunately, in present WCDMA terminals the AGC bandwidth is typically set to be constant, perhaps based on an anticipated speed at which the WCDMA terminal is to be used. In this case, BER performance will degrade considerably when the terminal speed does not match some preset speed to which the fixed AGC bandwidth is meant to correspond.

Accordingly, there exists a need for AGC which does not suffer from one or more of the above-noted problems exhibited by conventional AGC methodologies.

SUMMARY OF THE INVENTION

The present invention meets the above-noted need by providing, in an illustrative embodiment thereof, an AGC circuit having a bandwidth that is advantageously adjusted based on a motion of its corresponding terminal. In this manner, the AGC bandwidth can be more optimally matched to the speed at which the corresponding terminal is moving, rather than being fixed at some prescribed bandwidth value. Since BER performance depends to a large degree on how well the AGC bandwidth is matched to the speed of the AGC system, BER performance can be significantly improved using techniques of the present invention.

In accordance with one aspect of the invention, an apparatus including AGC includes at least one VGA operative to receive an input signal and to generate an amplified signal. A gain of the VGA is controlled as a function of at least a first control signal. The apparatus further includes an AGC circuit coupled to the VGA and being operative to generate the first control signal. The AGC circuit has a bandwidth that is controlled as a function of at least the amplified signal and a second control signal, the second control signal being indicative of a motion of the apparatus.

In accordance with another aspect of the invention, an integrated circuit (IC) includes at least one AGC system, the AGC system including at least one VGA operative to receive an input signal and to generate an amplified signal. A gain of the VGA is controlled as a function of at least a first control signal. The IC further includes an AGC circuit coupled to the VGA and being operative to generate the first control signal. The AGC circuit has a bandwidth that is controlled as a function of at least the amplified signal and a second control signal, the second control signal being indicative of a motion of the IC.

In accordance with yet another aspect of the invention, a system is provided including at least one base station and a plurality of terminals adapted for communicating with the base station. At least one of the terminals in the system includes at least one VGA operative to receive an input signal and to generate an amplified signal. A gain of the VGA is controlled as a function of at least a first control signal. The terminal further includes an AGC circuit coupled to the VGA and being operative to generate the first control signal. The AGC circuit has a bandwidth that is controlled as a function of at least the amplified signal and a second control signal, the second control signal being indicative of a motion of the terminal.

These and other features and advantages of the present invention will become apparent from the following detailed description of illustrative embodiments thereof which is to be read in connection with the accompanying drawings.

DETAILED DESCRIPTION OF THE INVENTION

The present invention will be described herein in the context of illustrative AGC architectures. It should be understood, however, that the present invention is not limited to these or any particular AGC circuit arrangements. Rather, the invention is more generally applicable to techniques for advantageously optimizing the bandwidth of an AGC circuit by incorporating motion information into the AGC control signal. In this manner, techniques of the present invention provide enhanced BER performance over AGC systems in which the AGC bandwidth is constant or the AGC bandwidth is not properly matched to the speed of the apparatus utilizing the AGC circuit.

Figure 1:
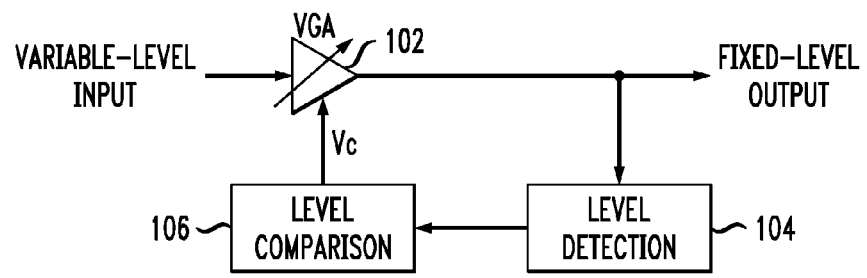
FIG. 1 is a block diagram depicting a conventional AGC circuit.
Figure 2:
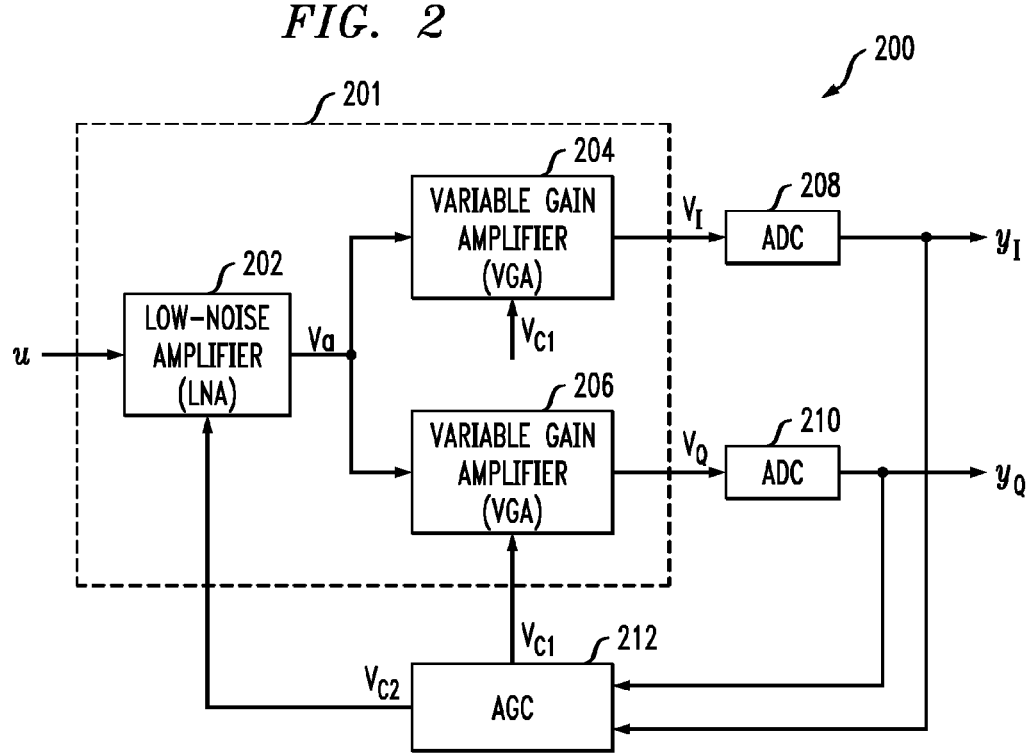
FIG. 2 is a block diagram depicting an illustrative AGC circuit in which techniques of the present invention may be implemented.

FIG. 2 is a block diagram depicting an illustrative AGC system 200 in which techniques of the present invention may be implemented. AGC system 200 includes a VGA 201 which is operative to receive an input signal, u, supplied to the AGC system and to generate one or more amplified output signals, $V_I$ and $V_Q$, which may correspond to in-phase (I) and quadrature (Q) components, respectively, of the input signal. The VGA 201 preferably comprises a first stage implemented as a low-noise amplifier (LNA) 202. The LNA 202 is operative to receive the input signal u and to generate a first amplified signal, Va, which is fed in parallel to a pair of VGAs, 204 and 206, operative to generate the amplified output signals $V_I$ and $V_Q$, respectively, of VGA 201. A gain and/or other characteristic (e.g., phase, frequency response, etc.) of VGAs 204, 206 is preferably controlled as a function of at least one control signal, $V_{C1}$, supplied thereto. A gain and/or other characteristic (e.g., phase, frequency response, etc.) of LNA 202 may also be controlled as a function of at least one control signal, $V_{C2}$, supplied thereto. In this manner, the overall gain and/or other characteristic of the VGA 201 may be selectively controlled. It is to be understood that VGA 201 is not limited to the particular configuration shown.

Each of the amplified output signals $V_I$ and $V_Q$ may be fed to a corresponding analog-to-digital converter (ADC), 208 and 210, respectively. Generally speaking, an ADC functions to convert an analog quantity, such as a voltage or a current, into a digital word of a prescribed bit count. Specifically, ADC 208 is operative to receive amplified output signal $V_I$ and to generate a signal, $y_I$, which is a digital representation of signal $V_I$. Likewise, ADC 210 is operative to receive amplified output signal $V_Q$ and to generate a signal, $y_Q$, which is a digital representation of signal $V_Q$. ADC circuits suitable for use with the present invention are well-known by those skilled in the art. For example, ADCs are described in the text ALAN B. GREBENE, BIPOLAR AND MOS ANALOG INTEGRATED CIRCUIT DESIGN 825-879 (John Wiley & Sons, Inc., 2003), which is incorporated by reference herein.

AGC system 200 further includes an AGC circuit 212. AGC circuit 212 is operative to receive one or more signals indicative of amplified output signals $V_I$ and/or $V_Q$, such as digital signals $y_I$ and/or $y_Q$, respectively, and to generate control signals $V_{C1}$ and $V_{C2}$ as a function thereof. Signals indicative of amplified output signals $V_I$ and $V_Q$ may include, for example, scaled versions of $V_I$ and $V_Q$, scaled versions of digital signals $y_I$ and $y_Q$, etc. AGC circuit 212 functions, at least in part, to compare the output signal, or signals, generated by VGA 201 with a desired reference signal and to generate control signals $V_{C1}$ and $V_{C2}$ for controlling the gain of VGA 201 so as to maintain the output signals $y_I$ and $y_Q$ at a substantially constant level.

Unfortunately, however, an AGC system, such as system 200, suffers from several distinct disadvantages. For instance, as previously stated, the AGC bandwidth is typically fixed based on a particular speed at which the system is to be used. When the terminal speed does not match some prescribed speed to which the fixed AGC bandwidth is meant to correspond, BER performance will degrade significantly.

Figure 3:
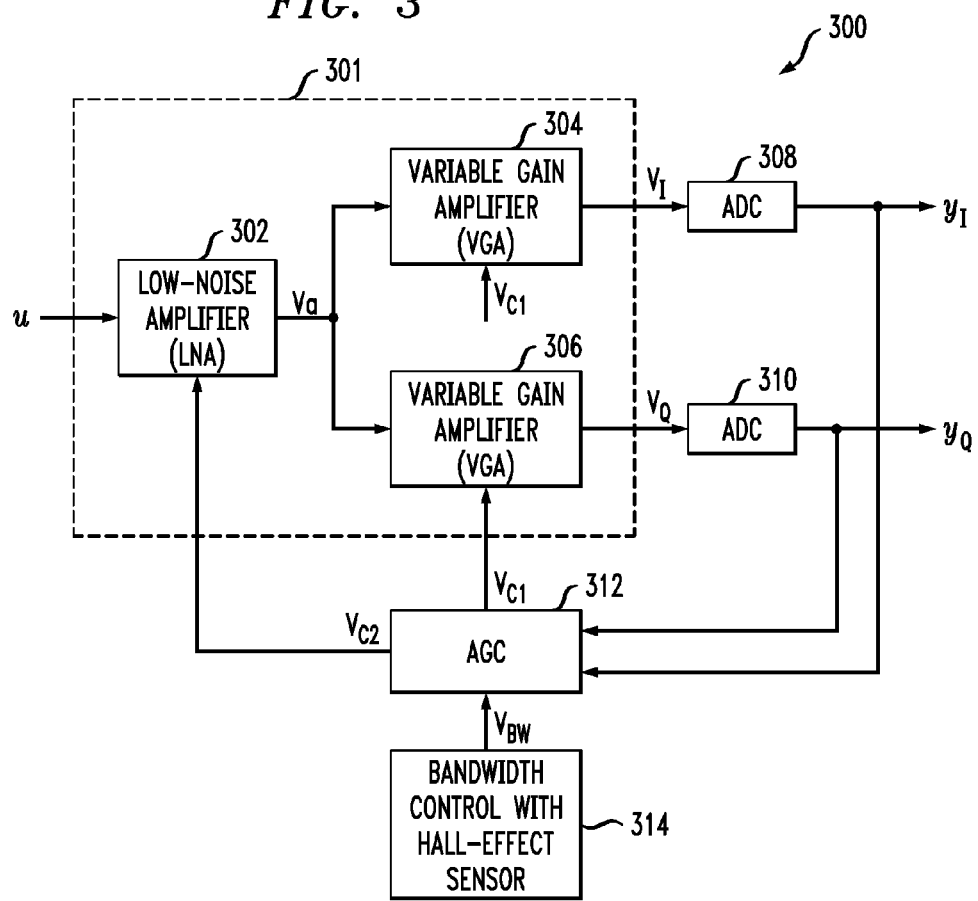
FIG. 3 is a block diagram depicting an exemplary AGC circuit, formed in accordance with an embodiment of the present invention.

FIG. 3 is a block diagram depicting an exemplary AGC system 300, formed in accordance with an embodiment of the present invention. Like AGC system 200 shown in FIG. 2, AGC system 300 includes a VGA 301 which is operative to receive an input signal, u, supplied to the AGC system and to generate one or more amplified output signals, $V_I$ and $V_Q$, which may correspond to in-phase and quadrature components, respectively, of the input signal. The VGA 301 preferably comprises a first stage implemented as a LNA 302 to reduce the total noise figure of the VGA 301. LNA 302 is operative to receive the input signal u and to generate a first amplified signal, Va, which is fed in parallel to a pair of VGAs, 304 and 306, operative to generate the amplified output signals $V_I$ and $V_Q$, respectively, of VGA 301.

The gain and/or other characteristic(s) (e.g., phase, frequency response, etc.) of VGAs 304, 306 is preferably controlled as a function of at least one control signal, $V_{C1}$, supplied to the VGAs 304, 306. Likewise, the gain and/or other characteristic(s) (e.g., phase, frequency response, etc.) of LNA 302 may be controlled as a function of at least one control signal, $V_{C2}$, supplied thereto. In this manner, the overall gain and/or other characteristic(s) of VGA 301 may be selectively controlled. LNAs and VGAs suitable for use in VGA 301 will be known to those skilled in the art. VGA circuits are described, for example, in the text ALAN B. GREBENE, BIPOLAR AND MOS ANALOG INTEGRATED CIRCUIT DESIGN 443-449 (John Wiley & Sons, Inc., 2003), which is incorporated by reference herein. It is to be understood that VGA 301 is not limited to the particular configuration shown.

Optionally, each of the amplified output signals $V_I$ and $V_Q$ may be fed to an input of a corresponding ADC, 308 and 310, respectively. Specifically, ADC 308 is operative to receive amplified output signal $V_I$ and to generate a signal, $y_I$, which is a digital representation of signal $V_I$. Likewise, ADC 310 is operative to receive amplified output signal $V_Q$ and to generate a signal, $y_Q$, which is a digital representation of signal $V_Q$. Signals $y_I$ and $y_Q$ are preferably digital words of a prescribed bit count. Although depicted as residing external to VGA 301, one or both of ADCs 308 and 310 may be incorporated into the VGA 301. ADC circuits suitable for use with the present invention are well-known to those skilled in the art. For example, ADC circuits are described in the text ALAN B. GREBENE, BIPOLAR AND MOS ANALOG INTEGRATED CIRCUIT DESIGN 825-879 (John Wiley & Sons, Inc., 2003), which is incorporated by reference herein. Consequently, a detailed description of ADC circuits will not be presented herein.

AGC system 300 further includes an AGC circuit 312. AGC circuit 312 is operative to receive one or more signals indicative of amplified output signals $V_I$ and/or $V_Q$, such as digital signals $y_I$ and/or $y_Q$, respectively, and to generate control signals $V_{C1}$ and $V_{C2}$ as a function thereof. Signals indicative of amplified output signals $V_I$ and $V_Q$ may include, for example, scaled versions of $V_I$ and $V_Q$, scaled versions of digital signals $y_I$ and $y_Q$, etc. AGC circuit 312 functions, at least in part, to compare the output signal, or signals, generated by VGA 301 with a desired reference signal and to generate control signals $V_{C1}$ and $V_{C2}$ for controlling the gain of VGA 301 so as to maintain the output signals $y_I$ and $y_Q$ at a substantially constant level. The AGC circuit 312 is connected to the VGA 301 in a closed loop feedback arrangement. This feedback configuration may also be referred to as to an AGC loop.

In a WCDMA application, the AGC system is generally required to have a large dynamic range. For example, as previously stated, the 3G specification requires that a receiver be able to accommodate signal levels between −106.7 dBm and −25 dBm. To minimize the time it takes for a WCDMA receiver to make measurements on the signal quality from neighboring base stations, the AGC loop should compensate for a new received power level as fast as possible. In order to sufficiently track power changes of the received signal, the AGC bandwidth is preferably made as wide as possible. However, if the AGC bandwidth is too high, then the system will exhibit an undesirable amount of gain noise. Thus, there exists a tradeoff in the AGC system 300 between AGC loop response time and gain noise. The desired AGC bandwidth of the system will depend, to a large extent, upon the speed of motion of the handsets or terminals used in the system. For instance, if a user is walking at a pedestrian speed of about 3 km/h, then the AGC bandwidth should be relatively narrow. Alternatively, if the user is driving in a car at a speed of about 120 km/h, then the AGC bandwidth should be relatively wide.

As previously explained, in present WCDMA terminals the AGC bandwidth is typically set to be constant, based in part on a particular speed at which the WCDMA terminal is to be used. In this case, BER performance will degrade considerably when the terminal speed does not match some preset speed to which the fixed AGC bandwidth is meant to correspond.

In order to improve BER performance, AGC system 300 includes a bandwidth control circuit 314 coupled to AGC circuit 312 for selectively controlling the bandwidth of the AGC loop as a function of a detected speed, or other motion, of the AGC system, in accordance with an aspect of the invention. Bandwidth control circuit 314 is preferably operative to detect a speed at which the AGC system 300 is moving (e.g., relative to a stationary object), a difference in speed relative to a reference speed, etc., and to generate a control signal, $V_{BW}$, which is preferably indicative of the detected speed or speed difference. The bandwidth of AGC circuit 312 is selectively controlled in response to signal $V_{BW}$.

Figure 4:
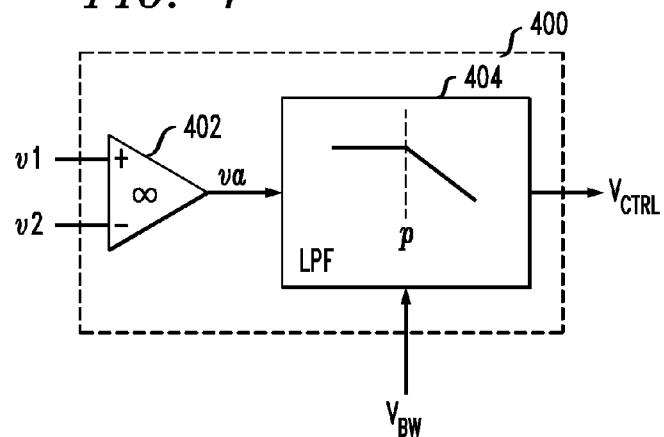
FIG. 4 is a block diagram depicting an illustrative AGC circuit which can be employed in the AGC circuit shown in FIG. 3.

FIG. 4 is a block diagram of an exemplary AGC circuit 400 which may be used to implement AGC circuit 312 shown in FIG. 3. AGC circuit 400 is depicted conceptually as an ideal operational amplifier (op-amp) 402 having infinite gain and infinite bandwidth connected to a low pass filter (LPF) 404 having unity gain and a single pole at a corner frequency, p, which is controllable as a function of control signal $V_{BW}$. Op-amp 402 is preferably configured to receive one or more input signals, v1 and v2, which may be representative of signals $y_I$ and $y_Q$, respectively, shown in FIG. 3, and to generate an output signal, va, which is a function of a difference between the input signals. LPF 404 is preferably configured to receive the amplified output signal va and to generate an output signal $V_{CTL}$. As long as signal va has a frequency which is less than the corner frequency p of LFP 404, signal $V_{CTL}$ will be essentially identical to signal va. If, however, signal va has a frequency which is greater than the corner frequency p of LPF 404, the magnitude of signal $V_{CTL}$ will be attenuated relative to signal va. Thus, the overall bandwidth of the AGC circuit 400 is selectively controllable as a function of signal $V_{BW}$.

There are numerous ways to implement LPF 404 which are contemplated by the present invention, as will become apparent to those skilled in the art. By way of example only and without loss of generality, LPF 404 may be implemented using a transconductance-capacitance ($g_m$-C) filter. Gm-C filters suitable for use in the present invention are well known in the art. In a $g_m$-C filter arrangement, the frequency response of the filter is primarily a function of a combination (e.g., ratio) of the transconductance ($g_m$) and the capacitance (C) of the filter. Since transconductance is controlled primarily as a function of current in transistor devices used to implement the $g_m$-C filter, control signal $V_{BW}$, which is assumed to be a voltage, can be converted into a current, $I_{BW}$, either within the AGC circuit 400 or elsewhere, for controlling the frequency response of the $g_m$-C filter.

In accordance with another embodiment of the invention, LPF 404 may be implemented using a switched capacitor filter circuit. In this filter arrangement, assuming control signal $V_{BW}$ is a voltage, $V_{BW}$ is preferably first converted to a clock signal having a frequency that is indicative of the control voltage. This may be accomplished, for example, using a voltage-to-frequency converter (VFC), or alternative conversion means. The clock signal may then be used as the sampling clock for the switched capacitor filter to thereby control the frequency response of the LPF 404.

In accordance with yet another embodiment of the invention, LPF 404 may comprise a capacitor matrix, or alternative capacitor selection arrangement. In this arrangement, control signal $V_{BW}$ is converted to a digital word that is indicative of the control signal, for example, using an analog-to-digital converter (ADC). This digital word is then used to reconfigure the capacitor matrix by physically changing which capacitors are connected in the circuit, or how they are connected (e.g., in series, in parallel, or a combination thereof), at any given time as a function of the digital word, thereby controlling the frequency response of the LPF 404. In accordance with another embodiment, rather than using a capacitor matrix, LPF 404 may be implemented using a digital finite impulse response (FIR) filter. In this manner, the digital word may be used to selectively modify the filter coefficients of the FIR filter to thereby control the frequency response of the LPF 404.

Figure 5:
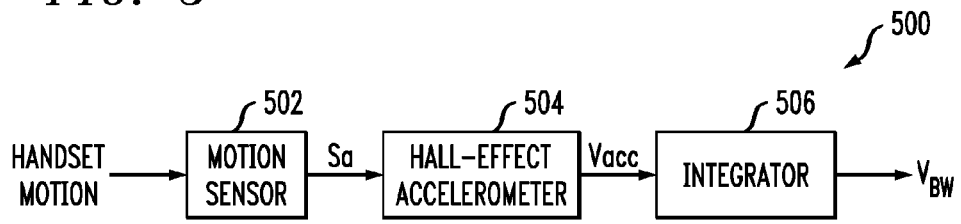
FIG. 5 is a block diagram depicting an exemplary AGC bandwidth control circuit, formed in accordance with an aspect of the present invention.

FIG. 5 is a block diagram depicting at least a portion of an exemplary bandwidth control circuit 500, formed in accordance with an embodiment of the invention. Bandwidth control circuit 500 preferably includes a motion sensor 502, a Hall-effect accelerometer 504, or alternative transducer, coupled to the motion sensor, and an integrator 506, or alternative filtering circuit, coupled to the accelerometer. Motion sensor 502 is preferably operative to measure a rate of change of position, location and/or displacement of the AGC system, such as, for example, the speed of the AGC system relative to a fixed object or relative to a reference speed, and to generate an analog signal, Sa, indicative thereof. For instance, signal Sa may be a resistance or an inductance value. Motion sensors suitable for use with the present invention are well known in the art. Hall-effect accelerometer 504 is operative to receive the analog motion signal Sa and to generate a voltage, Vacc, which is indicative of the motion signal. Accelerometers suitable for use with the present invention are well known in the art. Voltage signal Vacc is preferably integrated over time by integrator 506 to generate control signal $V_{BW}$. Integrator 506 may comprise, for example, an operational amplifier and a capacitor connected to the amplifier in a feedback configuration. Various other integrator implementations are similarly contemplated by the invention. For example, in a digital implementation, Hall-effect accelerometer 504 may generate a digital word that is indicative of the motion signal Sa. In this instance, integrator 506 may be implemented as an accumulator (e.g., summation circuit).

Figure 6:
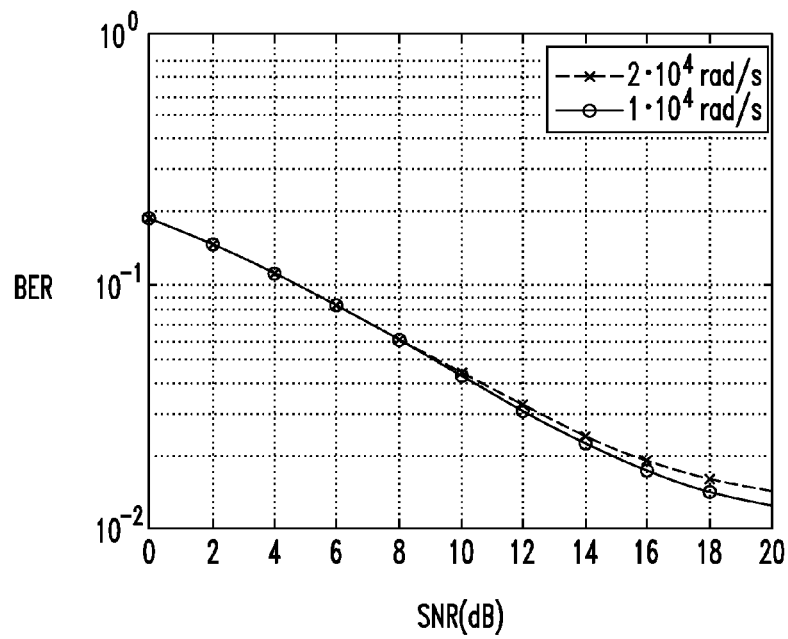
FIG. 6 is a graphical representation illustrating exemplary BER performance for a pedestrian model with a fast AGC, in accordance with an aspect of the present invention.

FIG. 6 is a graphical representation illustrating exemplary BER performance for a pedestrian model with a fast AGC, in accordance with an aspect of the present invention. The figure shows BER as a function of signal-to-noise ratio (SNR), in decibels (dB), for two different loop bandwidths. The two loop bandwidths are 20,000 radians per second (rad/sec) and 10,000 rad/sec. This figure shows that for a fixed SNR, the BER performance is dependent upon the loop bandwidth.

Figure 7:
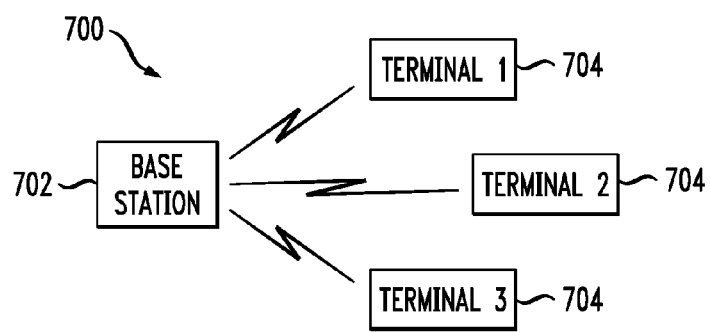
FIG. 7 is a block diagram depicting an illustrative communication system in which the AGC techniques of the present invention may be employed.

FIG. 7 depicts an illustrative communication system 700 in which the AGC techniques of the present invention may be employed, in accordance with another aspect of the invention. Communication system 700 may include at least one base station 702 and a plurality of terminals 704, each of the terminals being adapted for communicating with the base station via a corresponding communication link, such as, for example, cellular, radio frequency (RF), infrared (IR), microwave, satellite, etc. The base station 702 may include, for example, a cellular or wireless fidelity (Wi-Fi) access point. A given one of the terminals 704 may comprise a portable device, including, but not limited to, a cellular phone, cordless phone, personal digital assistant (PDA), laptop computer, etc. One or more of the terminals 704 preferably includes an AGC circuit formed in accordance with techniques of the present invention described herein. The AGC circuit may be integrated, for example, in a transmitter circuit included in the terminal. It is to be appreciated that the AGC techniques of the present invention may be similarly employed in other systems and applications in which it is desirable to advantageously match the bandwidth of an AGC circuit to the speed of the apparatus utilizing the AGC circuit.

At least a portion of the AGC methodologies of the present invention may be implemented in an integrated circuit. In forming integrated circuits, a plurality of identical die is typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An apparatus including automatic gain control (AGC), the apparatus comprising:
   at least one variable gain amplifier (VGA) operative to receive an input signal and to generate an amplified signal, a gain of the VGA being controlled as a function of at least a first control signal; and
   an AGC circuit coupled to the VGA and being operative to generate the first control signal as a function of at least the amplified signal, the AGC circuit having a bandwidth that is controlled as a function of at least a second control signal such that the bandwidth is independent of the amplified signal;
   wherein the AGC circuit is operative to receive the second control signal, the second control signal being indicative of a motion of the apparatus.

2. The apparatus of claim 1, wherein the apparatus comprises a bandwidth control circuit operative to measure a motion of the apparatus and to generate the second control signal as a function of the motion of the apparatus.

3. The apparatus of claim 2, wherein the bandwidth control circuit comprises:
   a motion sensor operative to convert a motion of the apparatus into a first signal indicative of the motion of the apparatus;
   a transducer coupled to the motion sensor, the transducer being operative to receive the first signal and to generate a voltage signal indicative of the first signal; and
   an integrator coupled to the transducer, the integrator being operative to receive the voltage signal and to generate the second control signal.

4. The apparatus of claim 3, wherein the motion sensor is operative to measure at least one of a rate of change of position of the apparatus, a location of the apparatus, and a displacement of the apparatus relative to a fixed object.

5. The apparatus of claim 3, wherein the motion sensor is operative to measure at least one of a rate of change of position of the apparatus, a location of the apparatus, and a displacement of the apparatus relative to a reference speed.

6. The apparatus of claim 3, wherein the transducer comprises a Hall-effect accelerometer.

7. The apparatus of claim 3, wherein the integrator comprises an operational amplifier and at least one capacitive element connected to the amplifier in a feedback configuration.

8. The apparatus of claim 1, wherein the second control signal is generated independently of the input signal.

9. The apparatus of claim 1, wherein the AGC circuit comprises:
   an amplifier operative to receive at least one signal that is indicative of the amplified signal and to generate a second amplified signal as a function thereof; and
   a low-pass filter having substantially unity gain and having a frequency response that is controllable as a function of the second control signal, the filter being operative to receive the second amplified signal and the second control signal and to generate, as an output thereof, the first control signal.

10. The apparatus of claim 9, wherein the low-pass filter comprises a transconductance-capacitance ($g_m$-C) filter, a frequency response of the $g_m$-C filter being controllable as a function of a current in the $g_m$-C filter, the current in the $g_m$-C filter being a function of the second control signal.

11. The apparatus of claim 9, wherein the low-pass filter comprises a switched capacitor filter circuit, a frequency response of the switched capacitor filter circuit being controlled as a function of a sampling rate of the switched capacitor filter circuit, the sampling rate of the switched capacitor filter circuit being a function of the second control signal.

12. The apparatus of claim 9, wherein the low-pass filter comprises a capacitor matrix including a plurality of capacitors, a frequency response of the capacitor matrix being controlled as a function of a connection arrangement of the plurality of capacitors in the capacitor matrix, the connection arrangement being a function of the second control signal.

13. The apparatus of claim 9, wherein the low-pass filter comprises a finite impulse response (FIR) filter, a frequency response of the FIR filter being controlled as a function of respective values of one or more FIR filter coefficients, the values of the FIR filter coefficients being a function of the second control signal.

14. The apparatus of claim 1, wherein the VGA comprises at least one low-noise amplifier (LNA) circuit and at least one VGA circuit coupled to the LNA circuit, the LNA circuit including an input adapted to receive the input signal, the LNA being operative to generate a second signal at an output of the LNA circuit, the VGA circuit including an input adapted to receive the second signal from the LNA circuit, the VGA circuit being operative to generate the amplifier output signal at an output of the VGA circuit.

15. The apparatus of claim 1, further comprising at least one analog-to-digital converter (ADC) coupled to the at least one VGA, the ADC being operative to receive the amplified signal and to generate a digital signal indicative of the amplified signal.

16. The apparatus of claim 1, wherein the apparatus is a terminal of a communication system.

17. An integrated circuit including at least one automatic gain control (AGC) system, the at least one AGC system comprising:
   at least one variable gain amplifier (VGA) operative to receive an input signal and to generate an amplified signal, a gain of the VGA being controlled as a function of at least a first control signal; and
   an AGC circuit coupled to the VGA and being operative to generate the first control signal as a function of at least the amplified signal, the AGC circuit having a bandwidth that is controlled as a function of at least a second control signal such that the bandwidth is independent of the amplified signal;
   wherein the AGC circuit is operative to receive the second control signal, the second control signal being indicative of a motion of the AGC system.

18. The integrated circuit of claim 17, wherein the AGC system comprises a bandwidth control circuit operative to measure a motion of the AGC system and to generate the second control signal as a function of the motion of the AGC system.

19. The integrated circuit of claim 18, wherein the bandwidth control circuit comprises:
   a motion sensor operative to convert a motion of the apparatus into a first signal indicative of the motion of the apparatus;
   a transducer coupled to the motion sensor, the transducer being operative to receive the first signal and to generate a voltage signal indicative of the first signal; and
   an integrator coupled to the transducer, the integrator being operative to receive the voltage signal and to generate the second control signal.

20. The integrated circuit of claim 17, wherein the second control signal is generated independently of the input signal.

21. The integrated circuit of claim 17, wherein the AGC circuit comprises:
   an amplifier operative to receive at least one signal that is indicative of the amplified signal and to generate a second amplified signal as a function thereof; and
   a low-pass filter having substantially unity gain and having a frequency response that is controllable as a function of the second control signal, the filter being operative to receive the second amplified signal and the second control signal and to generate, as an output thereof, the first control signal.

22. A system including at least one base station and a plurality of terminals adapted for communicating with the base station, at least one of the terminals in the system comprising:
   at least one variable gain amplifier (VGA) operative to receive an input signal and to generate an amplified signal, a gain of the VGA being controlled as a function of at least a first control signal; and
   an AGC circuit coupled to the VGA and being operative to generate the first control signal as a function of at least the amplified signal, the AGC circuit having a bandwidth that is controlled as a function of at least a second control signal such that the bandwidth is independent of the amplified signal;
   wherein the AGC circuit is operative to receive the second control signal, the second control signal being indicative of a motion of the terminal.

\* \* \* \* \*